United States Patent [19]

Yamada et al.

[11] Patent Number: 5,501,739
[45] Date of Patent: Mar. 26, 1996

[54] APPARATUS AND METHOD FOR FORMING THIN FILM

[75] Inventors: Yuichiro Yamada, Suita; Naoki Suzuki, Neyagawa; Ryuzo Houchin, Hirakata; Noboru Nomura, Kyoto; Kousaku Yano, Katano; Yuka Terai, Osaka, all of Japan

[73] Assignee: Matsushita Electric Industrial Co., Ltd., Osaka, Japan

[21] Appl. No.: 158,305

[22] Filed: Nov. 29, 1993

[30] Foreign Application Priority Data

Nov. 27, 1992 [JP] Japan .................................. 4-318824

[51] Int. Cl.$^6$ ................................ C23C 16/00
[52] U.S. Cl. .................. 118/719; 118/715; 118/725; 118/726; 118/729
[58] Field of Search ........................ 118/715, 719, 118/725, 726, 729

[56] References Cited

U.S. PATENT DOCUMENTS

| | | | |
|---|---|---|---|
| 4,048,955 | 9/1977 | Anderson | 118/719 |
| 4,628,006 | 12/1986 | Rathbun | 437/229 |
| 4,847,469 | 7/1989 | Hofmann | 118/726 |
| 4,947,789 | 8/1990 | Hussla | 118/726 |
| 5,203,925 | 4/1993 | Shibuya | 118/726 |
| 5,286,296 | 2/1994 | Sato | 118/719 |

FOREIGN PATENT DOCUMENTS 435088 7/1991 European Pat. Off. .

OTHER PUBLICATIONS

Burggraaf, Semiconductor International, Aug. 1990, pp. 56–63.

Primary Examiner—Richard Bueker
Attorney, Agent, or Firm—Wenderoth, Lind & Ponack

[57] ABSTRACT

A forming apparatus of a thin film includes a processing chamber where a predetermined process is carried out on a surface of a supplied substrate. A feeding device is provided in the processing chamber for feeding material to form an organic molecular layer including silicon or germanium on the surface of the substrate. A forming method of a thin film includes the steps of forming the thin film on the surface of the supplied substrate in the processing chamber, and feeding material for forming the organic molecular layer, including silicon or germanium, on the formed thin film on the surface of the substrate through a feeding device in the processing chamber, and then forming the organic molecular layer on the surface of the substrate.

9 Claims, 10 Drawing Sheets

Fig. 2
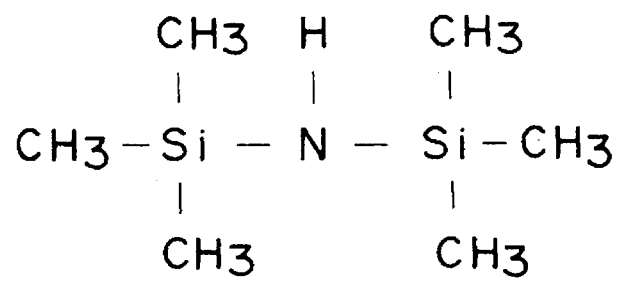
+
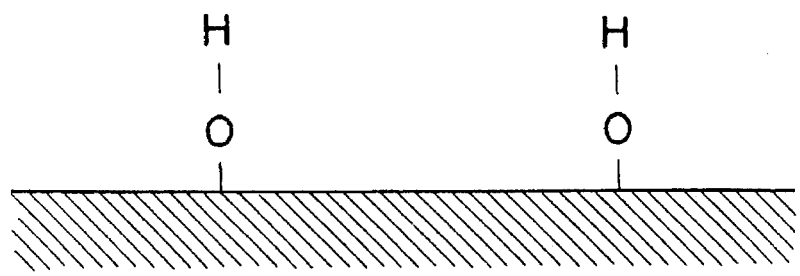
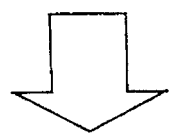
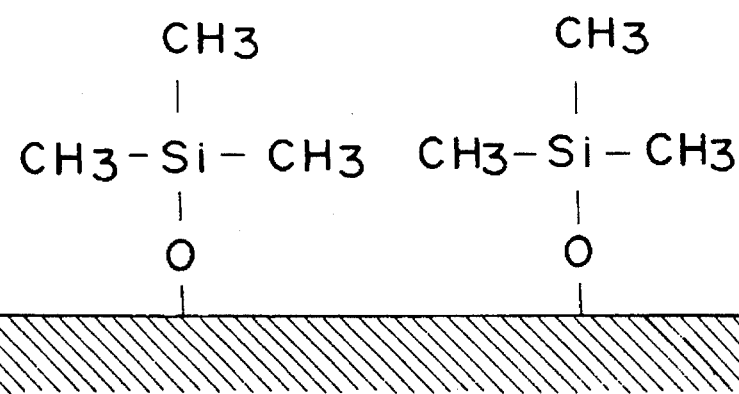

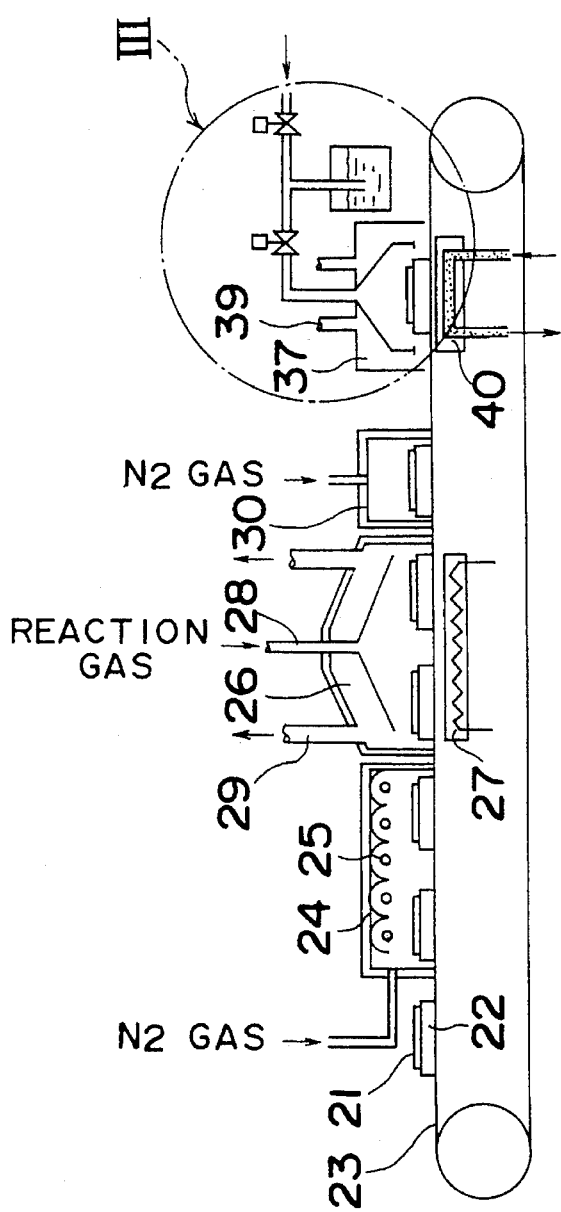
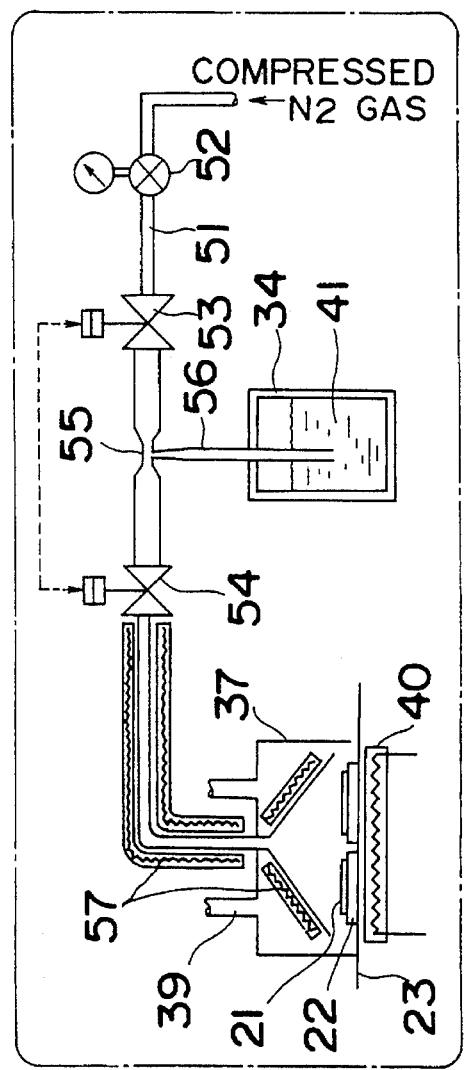

APPARATUS AND METHOD FOR FORMING THIN FILM

BACKGROUND OF THE INVENTION

The present invention relates to an apparatus and method for forming a thin film to be used in semiconductor devices or liquid crystal panels, etc., and an apparatus and method for forming a film and pattern-etching to obtain the desired thin film that is particularly designed to improve the yield.

With the remarkable progress of semiconductor devices toward high-density and a highly integrated structure, the devices become more and more finely constructed in complicate arrangements fully utilizing multi-layered wiring technology.

Conventionally, BPSG films, $SiO_2$ films, PSG films, NSG films, or SiON films obtained through atmospheric pressure CVD, low pressure CVD, or plasma CVD are often used as interlayer dielectrics. Or, a liquid glass agent applied on a substrate with metallic wiring is set up through thermal treatment to thereby to obtain an interlayer dielectric film.

One example of a conventional thin film forming apparatus will be described with reference to FIG. 10.

FIG. 10 illustrates the structure of a conventional atmospheric pressure CVD apparatus employed in a manufacturing process of semiconductors. In FIG. 10, a substrate 1 set on a transfer holder 2 is sent to a lamp heating chamber 4 while it is supported on a conveyor 3 driven by a driving means (not shown). The ambience in the chamber 4 is controlled by an inert gas such as nitrogen gas or the like. The substrate 1, preliminarily heated in the lamp heating chamber 4, is sent to an atmospheric CVD film forming chamber 5. In the film forming chamber 5, the substrate 1 is kept at a predetermined temperature by a heater 6 via the transfer holder 2 in order to react at the surface thereof with a reaction gas introduced into the chamber 5 through a gas nozzle 7. At this time, while a predetermined pressure is impressed on the reaction gas by a pressure control means (not shown), the reaction gas is discharged from a discharge port 8. As a result, a desired BPSG film or an $SiO_2$ film is formed. The reaction gas for the BPSG film is a mixture of silane (represented as $SiH_4$ hereinbelow), oxygen (represented by $O_2$ hereinafter), phosphine ($PH_3$), and diborane ($B_2H_6$). On the other hand, the reaction gas for the $SiO_2$ film is mixture of tetraethoxysilane (TEOS) and ozone ($O_3$). The substrate 1 on which the above film is formed is then sent into a cooling chamber 9 by the holder 2 and the conveyor 3, and cooled to a predetermined temperature in a nitrogen atmosphere. Thereafter, the substrate is separated from the holder 2 by a carry-out arm 10 and stored in a substrate cassette 11.

In general, the aforementioned BPSG films, $SiO_2$ films, PSG films, NSG films, SiON films, etc. have high hygroscopic properties. Therefore, the films absorb moisture over time, resulting in dust on the surface thereof and inviting a deterioration of their insulating properties.

Moreover, if a metallic wiring pattern, a semiconductor film pattern, or an insulating film pattern is also present on the surface of the substrate, the forming speed of the films or the quality of the films may differ depending on the differences of the surface properties of the films.

In the prior art, therefore, the thin BPSG films absorbing moisture cannot be avoided while the substrate 1 with the film is stored in the substrate cassette 11 or the substrate 1 is carried and transferred to a next process, resulting in the reaction of B and P in the film, with dust generated on the surface of the substrate 1 or the insulation of the film being deteriorated. That is, the quality of the films cannot be maintained to be constant and stable, and the yield is poor.

In the case where the surface of the substrate, before the film is formed thereon by an atmospheric pressure CVD apparatus, is not coated with a layer of single quality, e.g., if a metallic wiring pattern, a semiconductor film pattern, or an insulating film pattern is intermingled, the thickness or the quality of the $SiO_2$ film cannot be uniformly secured due to the dependency on the undercoat, and the yield is lowered.

SUMMARY OF THE INVENTION

The object of the present invention is therefore to provide an apparatus and method for forming a thin film which can prevent the generation of dust on the surface of a film after the film is formed on a substrate and the deterioration of the properties of the film.

In accomplishing the object, according to one aspect of the present invention, there is provided a forming apparatus of a thin film comprising a processing chamber where a predetermined process is carried out on a surface of a supplied substrate, and a feeding device provided on the processing chamber for feeding material to form an organic molecular layer, including silicon or germanium, on the surface of the substrate.

According to another aspect of the present invention, there is provided a forming method of a thin film, comprising steps of:

forming a thin film on a surface of a supplied substrate in a processing chamber; and feeding material for forming an organic molecular layer including silicon or germanium on the formed thin film on the surface of the substrate through a feeding device in the processing chamber, and then forming the organic molecular layer on the surface of the substrate.

BRIEF DESCRIPTION OF THE DRAWINGS

The above and other objects and features of the present invention will become clear from the following description taken in conjunction with preferred embodiments thereof and with reference to the accompanying drawings, throughout which like parts are designated by like reference numerals, and in which:

FIG. 2 is a diagram explanatory of a reaction when an organic molecular layer is formed;

FIGS. 3A and 3B are a cross sectional view and an enlarged view of the portion shown by arrow III in FIG. 3A, respectively, of a forming chamber of an organic molecular layer in a modification of the first embodiment;

DETAILED DESCRIPTION OF THE PREFERRED EMBODIMENTS

Figure 1:
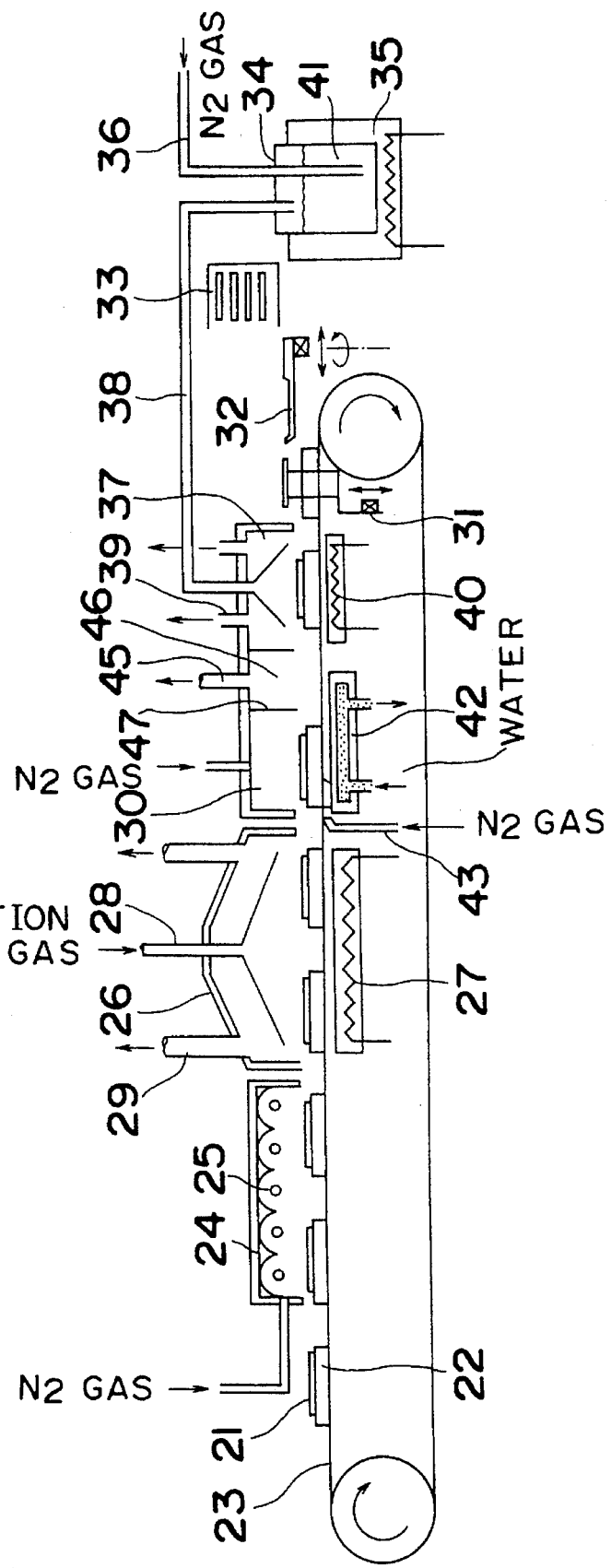
FIG. 1 is a cross sectional view of an atmospheric pressure CVD apparatus in a first embodiment of the present invention.

Before the description of the present invention proceeds, it is to be noted that like parts are designated by like reference numerals throughout the accompanying drawings.

A first embodiment and modified examples thereof according to the present invention will be discussed with reference to FIGS. 1–4.

FIG. 1 illustrates the structure of an atmospheric pressure CVD apparatus. A substrate 21 is set on a conveyor 23 while the substrate 21 is held on a transfer holder 22, and sent to a heating chamber 24. The heating chamber 24, having a heating lamp 25 thereinside, heats the substrate 21 to a predetermined temperature. At this time, the ambience of the heating chamber 24 controlled by an inert gas, for example, nitrogen or the like. After the substrate 21 is completely heated, the substrate 21 is moved to a film forming chamber 26 on the conveyor 23. A gas nozzle 28 is extended into the film forming chamber 26. A discharge port 29 of the chamber 26 is connected to a discharging means (not shown). $SiH_4$, $O_3$, $PH_3$, and $B_2H_6$ gas is supplied as reaction gas onto the substrate 21 through the gas nozzle 28. The flow rate of each gas is controlled and also the pressure in the chamber 26 is controlled approximately at normal pressures. Moreover, the temperature of the substrate 21 here is controlled by a heater 27. In this condition, the reaction gas forms a thin BPSG film of the predetermined thickness on the substrate 21, and is then discharged out from the discharge port 29.

After the BPSG film is formed on the substrate 21, the substrate 21 held on the transfer holder 22 is carried to a cooling chamber 30. $N_2$ gas is introduced into the cooling chamber 30 so as to prevent properties from changing on the surface of the substrate 21 and to facilitate the cooling effect through heat transfer. At the same time, a cooling plate 42 having a cooling water conduit arranged therein is provided below the transfer holder 22 to positively cool the transfer holder 22 and the substrate 21. $N_2$ gas is supplied towards the gap between the upper surface of the cooling plate 42 and the transfer holder 22 by a cooling gas nozzle 43. After the substrate 21 and the transfer holder 22 are cooled to predetermined temperatures in the cooling chamber 30, the substrate 21 and the substrate holder 22 are guided to an organic molecular layer forming chamber 37.

An organic liquid material 41 for forming an organic molecular layer, hexamethyldisilazane (referred to as HMDS), is sealed in an organic liquid container 34. Nitrogen gas as a bubbling gas is fed via a gas flow control means (not shown) from an introduction port 36 inserted into the organic liquid material 41 from outside the container 34. The HMDS is heated to approximately 130° C. in a heating container 35 and gasified subsequent to the rise of the vapor pressure. The gasified HMDS, along with the bubbling nitrogen gas, is brought into the organic molecular layer forming chamber 37 via an organic material gas feed pipe 38. As a result, an organic molecular layer is formed on the surface of the substrate 21, which is kept at about 130° C. by a heater 40 while HMDS is discharged from an HMDS discharge port 39. In order to separate the $N_2$ gas in the cooling chamber 30 and the gasified HMDS in the organic molecular layer forming chamber 37 from each other, a gas shutting room 46 is defined by a partition plate 47 between the chambers 30 and 37. The gas in the room 46 is discharged outside from a discharge port 45. After a predetermined organic molecular layer is formed on the substrate 21 in the forming chamber 37, the substrate 21 is taken out from the chamber 37 by the conveyor 23, put on a carrying arm 32 by a switching instrument 31, and stored in a cassette 33 by the carrying arm 32.

In the foregoing embodiment, when the organic molecular layer is formed, the substrate 21 is kept at 130° C. (reaction temperature), and the flow rate, the pressure, and the feeding time of the gasified HMDS are 5 sccm, 1 atm., and five minutes, respectively. Owing to the formation of the organic molecular layer, a hydrophobic surface layer is formed on the surface of the BPSG film, and therefore dust does not arise for 12 hours or more and the insulating properties of the film are good.

According to the atmospheric pressure CVD apparatus in the above embodiment, the organic molecular layer forming chamber 37 is coupled to the BPSG film forming chamber 26. Since the HMDS is supplied to the surface of the BPSG film after the HMDS is gasified by heating, an organic molecular layer including silicon which can prevent the absorption of water to the BPSG film is formed. Accordingly, dust is prevented from generating on the surface of the substrate and the properties of the film are prevented from deteriorating. In other words, since the surface of the thin BPSG film has an OH group unless the OH group is removed, the OH group would be readily coupled with the moisture to thereby generate dust or deteriorate the properties of the film. According to the embodiment, however, the organic material including silicon is supplied to the surface of the BPSG film and substituted for the H in the OH group, as indicated in FIG. 2, the O being coupled with Si. Accordingly, a hydrophobic organic molecular layer is formed to thereby prevent the generation of dust on the surface of the substrate and the deterioration of the film properties. The organic material can include germanium instead of silicon in order to substitute Ge for H in the OH group and still accomplish the same effect.

Although the HMDS as a liquid material to form the organic molecular layer is heated and bubbled in FIG. 1, the Venturi effect can be utilized as shown in FIGS. 3A and 3B. Referring to FIGS. 3A and 3B, the substrate 21, substrate holder 22, conveyor 23, organic molecular layer forming chamber 37, HMDS discharge port 39, heater 40, organic liquid container 34, and liquid HMDS 41 are the same as in FIG. 1, except that a narrow tube 56 is extended to the exterior of the container 34 from within the liquid HMDS 41. The tube 56 is connected to a narrow part 55 of a feed pipe 51 performing the Venturi effect. When compressed nitrogen gas is supplied into the feed pipe 51 via a pressure regulator 52, the nitrogen gas is turned into the jet flow at a narrow part 55, thereby sucking the liquid HMDS and further vaporizing or atomizing the liquid HMDS to feed it to the surface of the substrate 21. The liquid HMDS is supplied or stopped by automatic valves 53 and 54 arranged in the feed pipe 51 so that the narrow part 55 held between them is opened or closed simultaneously. Moreover, a heater 57 is provided in the feed pipe 51 to hold the HMDS in the vaporized state. The same effect as in FIG. 1 is hence achieved in the arrangement of FIGS. 3A and 3B.

Figure 4:
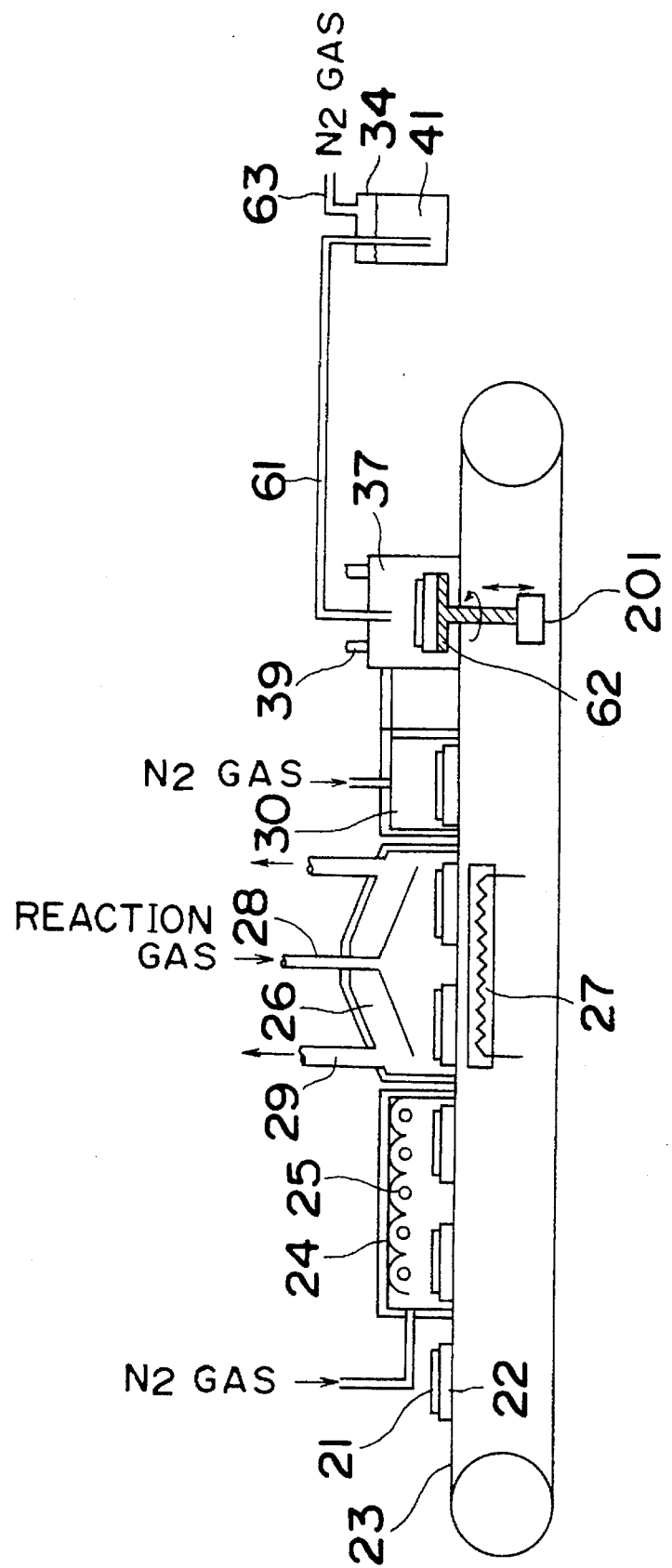
FIG. 4 is a cross sectional view of a forming chamber of an organic molecular layer in a further modification of the first embodiment.

In FIGS. 1, 3A, and 3B, the HMDS is supplied by heating and bubbling and also by the Venturi effect. However, the liquid HMDS can be dropped with the HMDS in the liquid state and applied all over the surface of the substrate 21 by a spin coating method. FIG. 4 shows an arrangement where the liquid HMDS is applied onto the substrate 21. In FIG. 4, the substrate 21, substrate holder 22, conveyor 23, organic molecular layer forming chamber 37, HMDS discharge port 39, organic liquid container 34, and liquid HMDS 41 are the same as in FIG. 1. A different point from FIG. 1 is that a predetermined pressure is impressed to the surface of the liquid HMDS 41 by nitrogen gas through a pressure pipe 63 connected to the organic liquid container 34, thereby sending the liquid HMDS into a liquid feed pipe 61 extended outside of the container 34. A predetermined amount of the liquid HMDS is dropped on the surface of the substrate 21 in the forming chamber 37. The substrate holder 22 holding the substrate 21 is mounted on a spin coater 62 rotated by a rotary driving device 201. The dropped liquid HMDS is spread and applied all over the surface of the substrate 21. The spin coater 62 has a heater (not shown) built thereinside, and therefore the surface temperature of the substrate 21 is maintained at approximately 130° C. when the liquid HMDS is applied. Accordingly, the same effect as in FIGS. 1, 3A, and 3B is achieved by the construction of FIG. 4.

Figure 5:
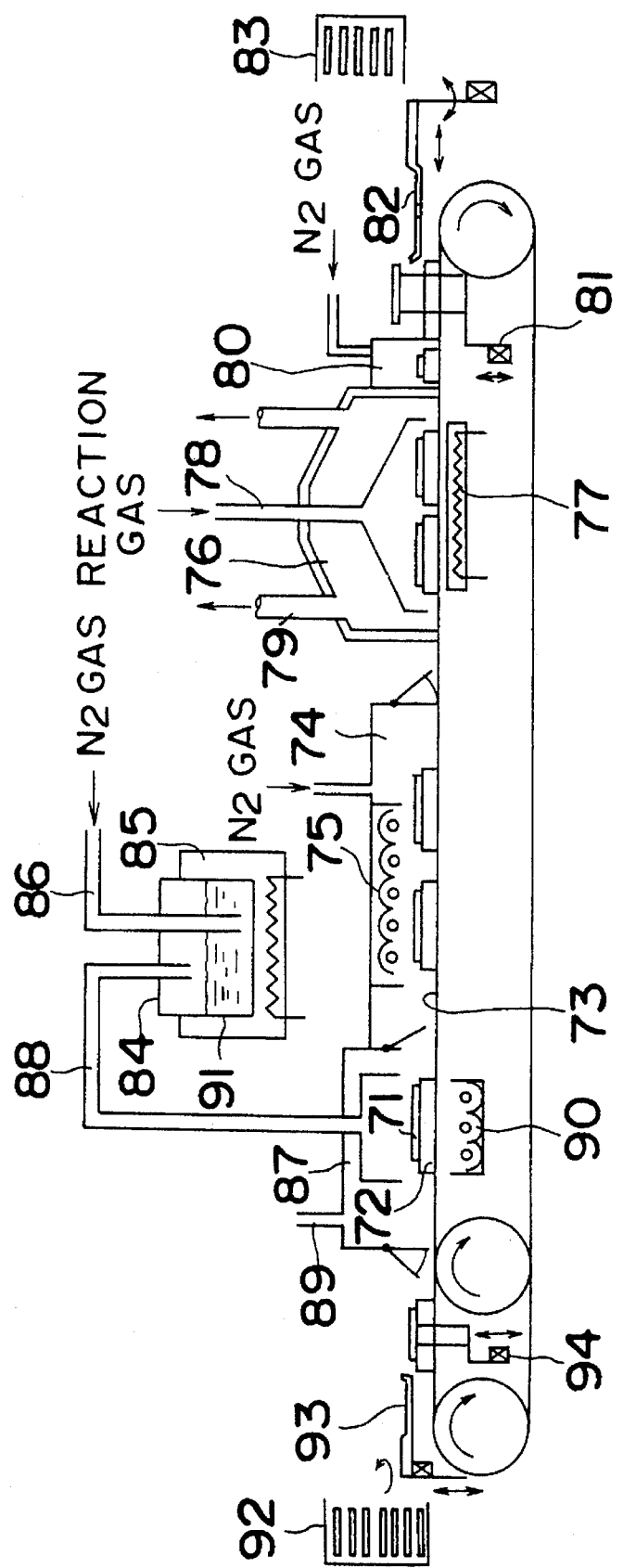
FIG. 5 is a cross sectional view of an atmospheric pressure CVD apparatus in a second embodiment of the present invention.

A second embodiment of the present invention will be depicted with reference to FIG. 5.

FIG. 5 shows an atmospheric pressure CVD apparatus for forming an $SiO_2$ film. Reference numerals in FIG. 5 denote respectively: 71 a substrate; 72 a substrate holder; 73 a conveyor; 74 a heating chamber; 75 a heating lamp; 76 a film forming chamber; 77 a heater; 78 a gas nozzle; 79 a discharge port; 80 a cooling chamber; 81 a switching instrument of substrates; 82 a carrying arm; 83 a cassette; 84 an organic liquid container; 85 a heating container; 86 a bubbling gas introduction port; 87 an organic molecular layer forming chamber; 88 an organic material gas feed pipe; 89 an HMDS discharge port; 90 a heater; and 91 an organic liquid material (HMDS). These are the same components as in the first embodiment of FIG. 1.

Referring further to FIG. 5, reference numeral 92 indicates a take-out cassette, 93 is a carrying arm, and 94 is a switching instrument at the side where the substrates are taken out.

The difference of the second embodiment from FIG. 1 is that the substrate 71 is sent to the organic molecular layer forming chamber 87 before the substrate 71 is processed in the film forming chamber 76 and, moreover, before the substrate 71 is preliminarily heated. That is, a target thin film is obtained by the atmospheric pressure CVD process after the organic molecular layer is formed on the surface of the substrate 71.

The operation will be described below.

A wiring pattern of aluminum alloy is formed on the substrate 71 after an insulating film is formed all over the surface of the substrate 71. Then, the substrate 71 is placed onto the transfer holder 72 on the conveyor 73 by the carrying arm 93 from the take-out cassette 92. The substrate 71, together with the transfer holder 72, is sent first to the organic molecular layer forming chamber 87. A hydrophobic uniform organic molecular layer mainly composed of silicon is formed all over the surface of the substrate 71 in the same manner as in FIG. 1. Subsequently, the substrate 71 is heated to a predetermined temperature in the heating chamber 74 and then sent to the film forming chamber 76. In the film forming chamber 76, a mixture of TEOS and $O_3$ gas is supplied as a reaction gas to the substrate 71 from the gas nozzle 78 while the flow rate of each gas is controlled and each gas is controlled at approximately normal pressures. The mixture of gas, while forming an $SiO_2$ film of a predetermined thickness, is discharged through the discharge port 79. The substrate 71, after having the $SiO_2$ film formed thereon, is cooled to a predetermined temperature in the cooling chamber 80 and then transferred to the transfer arm 82 by the switching instrument 81 and housed in the cassette 83.

The $SiO_2$ film obtained as above shows no dependency on the undercoat, i.e., no difference in the film quality, irregularity and the forming speed resulting from a difference between the insulating film and the wiring pattern. The surface of the insulating $SiO_2$ film is smooth.

As described hereinabove, in the atmospheric pressure CVD apparatus of the second embodiment of the present invention, the organic molecular layer forming chamber 87 is coupled to the film forming chamber 76, where the heated and bubbled HMDS including silicon is supplied to the surface of the substrate 71 to thereby form the organic molecular layer. Because the $SiO_2$ film is formed thereafter, the unevenness of the film quality because of the mixing of various kinds of materials on the undercoat is prevented.

Although HMDS as liquid material to form the organic molecular layer is heated and bubbled in the second embodiment as above, the Venturi effect can also be utilized as described earlier with reference to FIGS. 3A and 3B, or HMDS can be applied in the liquid state as shown in FIG. 4.

A third embodiment of the present invention will be discussed with reference to FIG. 6.

Figure 6:
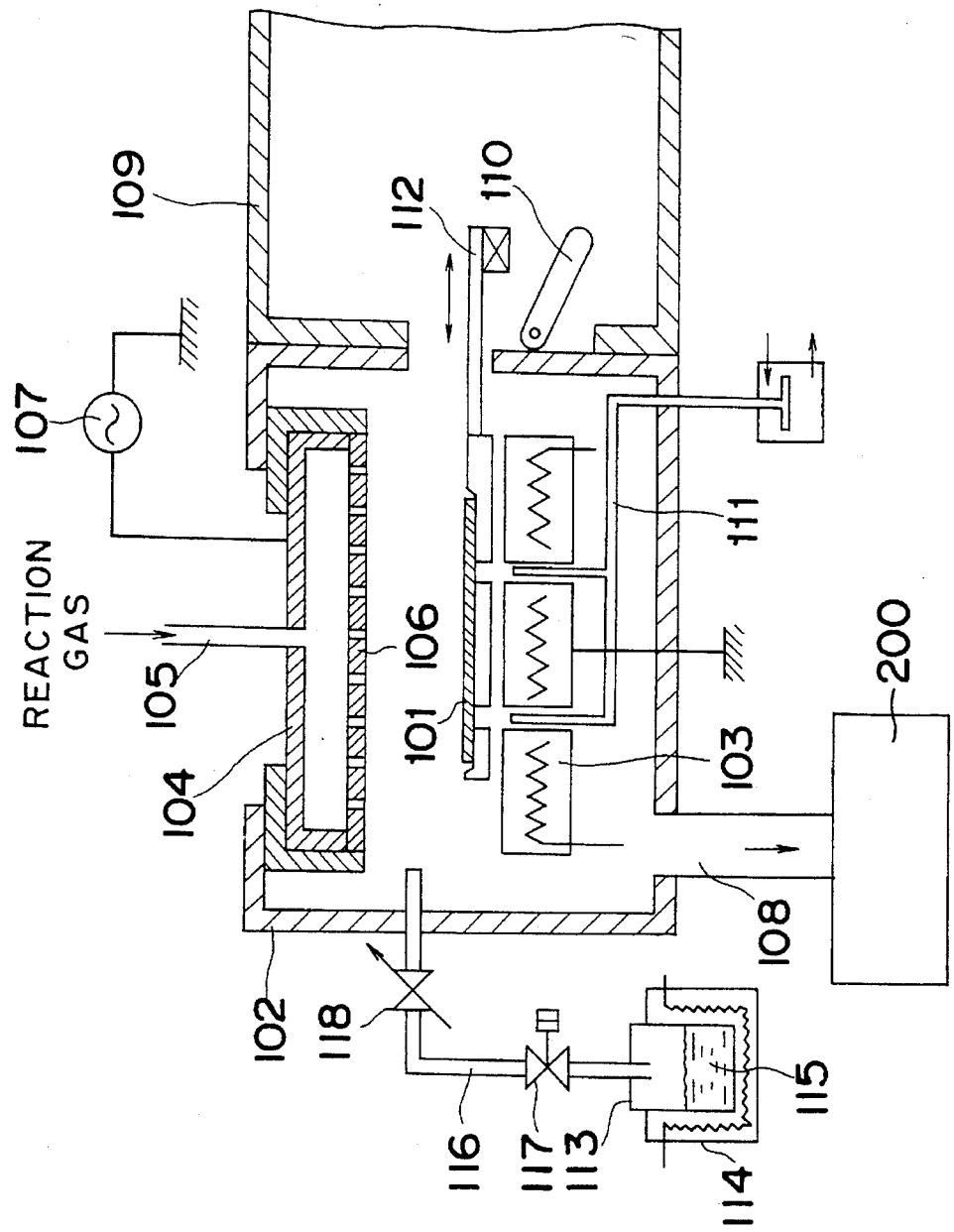
FIG. 6 is a cross sectional view of a thin film forming apparatus in a third embodiment of the present invention.

FIG. 6 shows the structure of a CVD apparatus or a plasma dry etching apparatus, in which reference numerals denote respectively: 101 a substrate; 102 a vacuum chamber; 103 a susceptor; 104 an impressing electrode; 105 a gas introduction port; 106 a gas blow-out plate; 107 a high frequency power source; 108 a discharge port; 109 an arm accommodating chamber; 110 a gate valve; 111 a push-up pin; 112 a transferring/holding arm; 113 an organic liquid container; 114 a heating container; 115 organic liquid material; 116 an organic material gas feed pipe; 117 a valve; 118 a flow control valve; and 200 an evacuating device. In the third embodiment here, the vacuum chamber 102 for a CVD or dry etching process works also as an organic molecular layer forming chamber.

The operation of the CVD apparatus will be described first.

The vacuum chamber 102 and the arm accommodating chamber 109 are kept in a vacuum by the evacuating device 200. The substrate 101 placed on the transferring/holding arm 112 is, through the gate valve 110, moved to the vacuum chamber 102 from the arm accommodating chamber 109. The substrate 101 is pushed up by the push-up pin 111 above the transferring/holding arm 112. The transferring/holding arm 112 is returned to the arm accommodating chamber 109, and at the same time the push-up pin 111 is lowered to place the substrate 101 onto the susceptor 103 having a heater thereinside. Then, with the gate valve 110 closed, the vacuum chamber 102 is evacuated to a predetermined degree of vacuum by a discharging means (not shown) connected to the discharge port 108, and the substrate 101 is heated to a predetermined temperature (for instance, 400° C.) via the susceptor 103. Thereafter, a reaction gas, namely, a mixture of $SiH_4$, $O_3$, $PH_3$, and $P_2H_6$ gas, is supplied onto the substrate 101 through the gas blow-out plate 106 from the gas introduction port 105 while the flow rate of each gas is controlled. During this time, the mixed gas is also discharged from the discharge port 108 via a pressure control valve (not shown), so that a thin BPSG film of a predetermined thickness is formed on the surface of the substrate 101.

After the BPSG film is formed on the substrate 101, the supply of the reaction gas is stopped and the vacuum chamber 102 is evacuated into a high vacuum state. The push-up pin 111 is raised to push up the substrate 101 and the transferring/holding arm 112 is moved below the substrate 101 by opening the gate valve 110. Then, the push-up pin 111 is lowered to place the substrate 101 onto the arm 112. At this time, since the transferring/holding arm 112 has a lower temperature than the substrate 101, the substrate 101 is cooled. More specifically, the substrate 101 is kept in the above state for a predetermined time thereby to be cooled to 200° C. or less. Subsequently, the valve 117 communicating with the organic liquid container 113 is opened to reduce the pressure inside the organic liquid container 113 and the organic material gas feed pipe 116 which connects the valve 117 with the vacuum chamber 102. The boiling point of the organic liquid material (HMDS) is consequently decreased to promote vaporization. The organic liquid material is thus supplied onto the substrate 101 in the vacuum chamber 102. Preferably, the flow control valve 118 provided in the middle of the organic material gas feed pipe 116 controls the flow rate of the vaporized organic material gas. It is preferable, in order to realize positive vaporization, that the organic liquid container 113 is accommodated in the heating container 114 to control the heating of the container 113.

The gas in the vacuum chamber 102 is discharged again through the discharge port 108 after the organic molecular layer including silicon is formed on the surface of the BPSG film as described in the foregoing embodiment. The transferring/holding arm 112 is returned to the arm accommodating chamber 109, thus completing a sequence of operations.

Now, a dry etching apparatus will be depicted hereinbelow.

An aluminum or aluminum alloy film is formed all over the surface of an insulating film, and a resist mask pattern is formed on the aluminum or aluminum alloy film of the substrate 101. The substrate 101 is placed on the susceptor 103, similar to the above operation of the CVD apparatus. A mixture of $BCl_3$ and chlorine or the like as an etching reaction gas is guided inside the vacuum chamber 102 while the flow rate of the gas is controlled at the gas introduction port 105 and the gas blow-out plate 106, and discharged through the discharge port 108 via a pressure control valve (not shown). While the vacuum chamber 102 is maintained at a predetermined degree of vacuum, high frequency power is supplied from the high frequency power source 107 to the electrode 104, whereby plasma is generated in a space between the blow-out plate 106, electrically coupled with the electrode 104, and the susceptor 103. The aluminum or aluminum alloy film is etched until the insulating undercoat film is exposed. Thereafter, the vacuum chamber 102 is once evacuated to a high degree of vacuum, and oxygen gas is fed into the vacuum chamber 102 via the gas blow-out plate 106. In consequence, plasma is again generated to react with the resist mask pattern to remove the pattern, thereby exposing the aluminum or aluminum alloy pattern.

Both the insulating film pattern and the aluminum or aluminum alloy pattern are mingled with each other and exposed on the surface of the substrate 101. Thereafter, an organic molecular layer including silicon is formed wholly on the surface of the substrate 101 in the same fashion as the CVD apparatus described above.

Since the vacuum chamber 102 for the CVD process serves also as the organic molecular layer forming chamber, it is possible to coat the organic molecular layer over the substrate after the BPSG film is formed on the substrate in the CVD process, without exposing the surface of the substrate to the air. Therefore, the BPSG film can be perfectly prevented from absorbing moisture, so that the generation of dust on the surface of the substrate or the deterioration of the film properties can be prevented.

In case of the dry etching, since the vacuum chamber 102 for dry etching process serves also as the organic molecular layer forming chamber, the organic molecular layer is formed without bringing the surface of the BPSG or the like insulating film exposed through etching of the aluminum or aluminum alloy pattern in touch with the air, and thus the BPSG film is surely prevented from absorbing moisture. Moreover, since the same organic molecular layer is formed both on the surface of the insulating film and on the surface of the aluminum or aluminum alloy pattern, the irregularity of the film due to the mixing of different kinds of material on the undercoat is prevented.

A fourth embodiment of the present invention will be described with reference to FIGS. 7 and 8.

Figure 7:
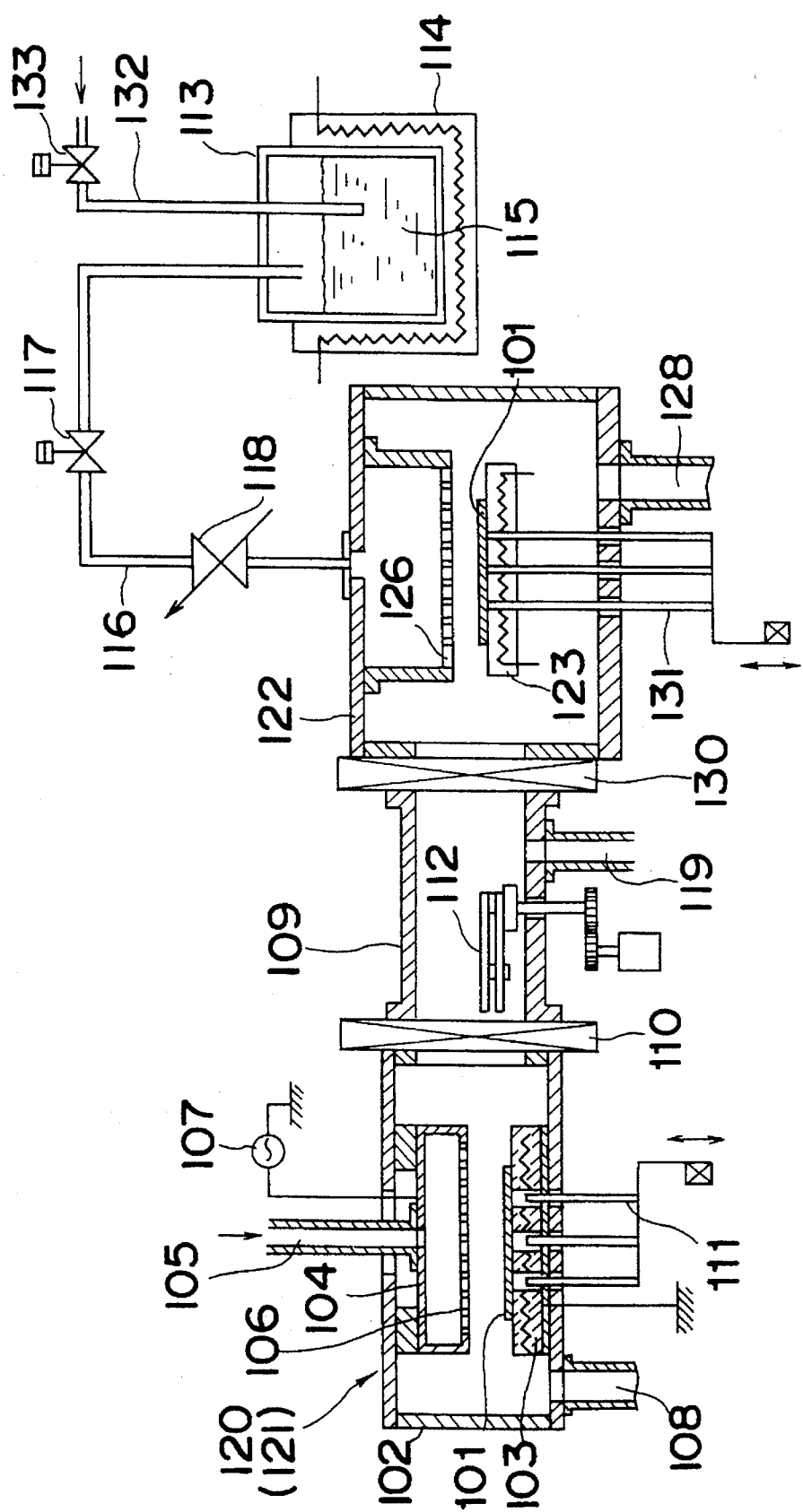
FIG. 7 is a cross sectional view of a thin film forming apparatus according to a fourth embodiment of the present invention.

FIG. 7 indicates the cross sectional structure of a CVD apparatus or a plasma dry etching apparatus. In FIG. 7, the reference numerals denote respectively: 101 a substrate; 102 a vacuum chamber constituting a CVD processing chamber 120 or a dry etching processing chamber 121; 103 a susceptor; 104 a to-be-impressed electrode; 105 a gas introduction port; 106 a gas blow-out plate; 107 a high frequency power source; 108 a discharge port; 109 an arm accommodating chamber; 110 a gate valve; 111 a push-up pin; 112 a transferring/holding arm; 113 an organic liquid container; 114 a heating container; 115 organic liquid material (HMDS); 116 an organic material gas feed pipe; 117 a valve; and 118 a flow control valve. The components are the same as shown in FIG. 6.

The fourth embodiment is different from the first embodiment in FIGS. 3A and 3B in that the vacuum chamber 102 works solely as a CVD process or a dry etching process, not serving to form an organic molecular layer, and an organic molecular layer forming chamber 122 is independently connected to the arm accommodating chamber 109 via a second gate valve 130. Further, reference numeral 119 denotes a second discharge port to evacuate the arm accommodating chamber 109, and reference numeral 128 denotes a third discharge port to evacuate the organic molecular layer forming chamber 122 and to discharge the organic material gas. The substrate 101 is held at a predetermined temperature in the range of 100°–200° C. by a second susceptor 123 when the organic molecular layer is formed. A heater for supporting the substrate 101 is incorporated in the second susceptor 123. The other reference numerals 126, 132, and 133 respectively denote an organic material gas blow-out plate, a bubbling $N_2$ feed pipe, a bubbling $N_2$ valve. The organic material gas feed pipe 116 is connected to the organic molecular layer forming chamber 122.

Figure 8:
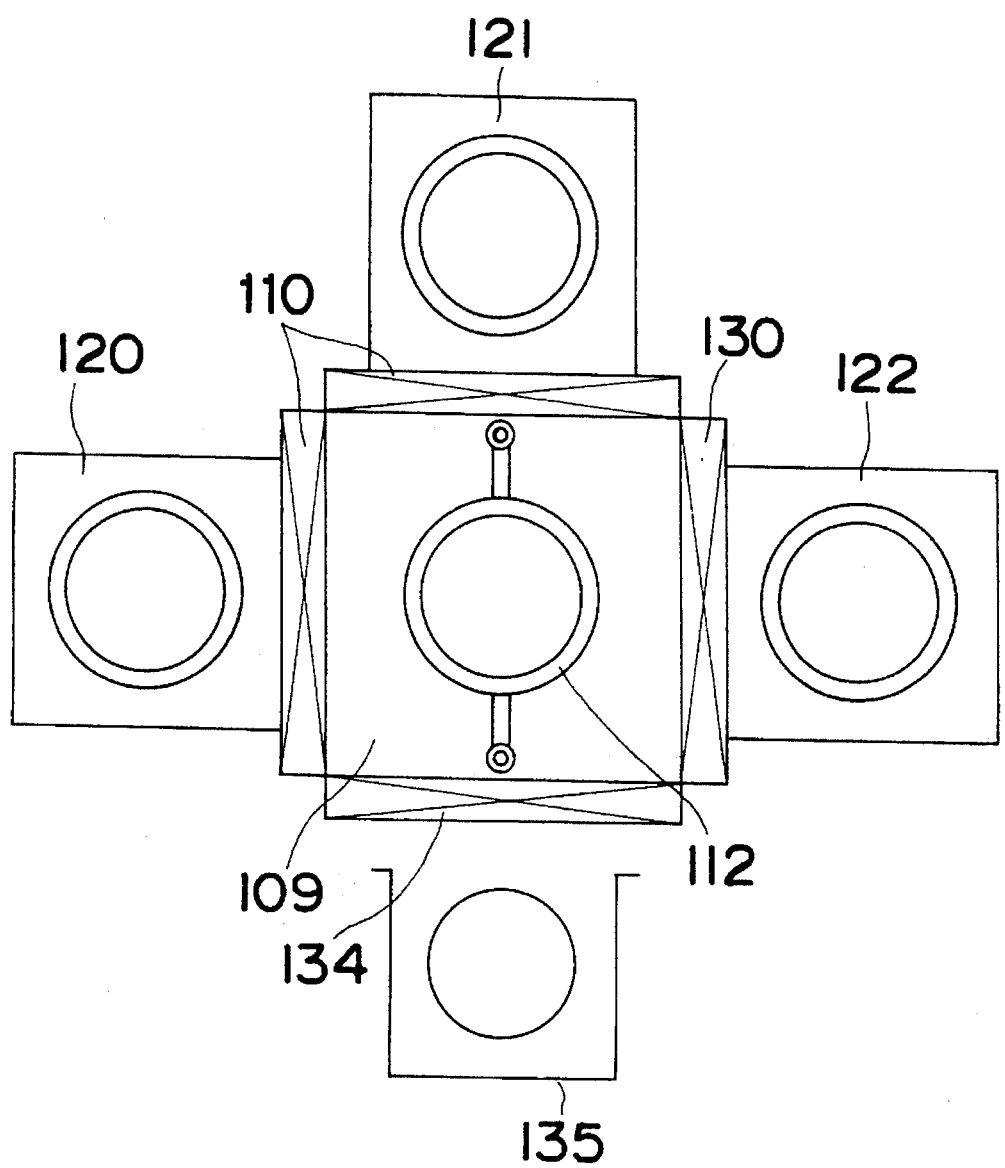
FIG. 8 is a plane view showing the disposition of the thin film forming apparatus of FIG. 7.

In the fourth embodiment, as is made clear from FIG. 8, the CVD processing chamber 120, the dry etching processing chamber 121, and the organic molecular layer forming chamber 122 are combined into one unit of the apparatus.

The operation of the unit will now be described.

The substrate 101 has an aluminum or aluminum alloy film formed all over the surface of an insulating film, with a resist mask pattern formed on the upper surface of the aluminum or aluminum alloy film. The substrate 101 is set in a loader/unloader section 135. The arm accommodating chamber 109 is changed to atmospheric pressure, and the substrate 101 is placed on the transferring arm 112 via a third gate valve 134. The arm accommodating chamber 109 is then evacuated through the second discharge port 119. The substrate 101 is then carried and transferred to each chamber by the transferring arm 112. The aluminum or aluminum alloy film is etched and the resist mask pattern is removed from the substrate 101 in the vacuum dry etching processing chamber 121 in the same manner as in the third embodiment. Then, the substrate 101 is moved by the transferring arm 112 to be placed on the second susceptor 123 inside the organic molecular layer forming chamber 122 held in the vacuum state. After the surface of the substrate 101 is heated to 130° C. by the built-in heater, the valve 117 and the bubbling $N_2$ valve 133 are opened to feed the HMDS gas as well as $N_2$ gas to the substrate 101 through the organic material gas feed pipe 116 and the organic material gas blow-out plate 126 with a plurality of through-holes. The gas is also discharged through the third discharge port 128 during this time. Accordingly, an organic molecular layer including silicon is formed on the surface of the substrate 101. The substrate 101 is then moved to the CVD processing chamber 120 in vacuum, where thin BPSG film is formed in the same operation as in the third embodiment. Then the substrate 101 is again moved to the organic molecular layer forming chamber 122, and the organic molecular layer including silicon is formed totally on the surface of the substrate 101 in the same manner as above.

As discussed hereinabove, according to the fourth embodiment of the present invention, since the CVD processing chamber 120, the dry etching processing chamber 121, and the organic molecular layer forming chamber 122 are connected to each other by the centered arm accommodating chamber 109 maintained in vacuum, the BPSG film or the like insulating film is prevented from being irregular due to the dependency on the undercoat of mixture of various kinds of material when the insulating film is formed by one apparatus. At the same time, the absorption of moisture by the BPSG film is completely prevented, so that the generation of dust and the deterioration of the film properties can be prevented. The substrate can be continuously processed through the dry etching and CVD treatments with good yield.

A fifth embodiment of the present invention will be explained with reference to FIG. 9.

Figure 9:
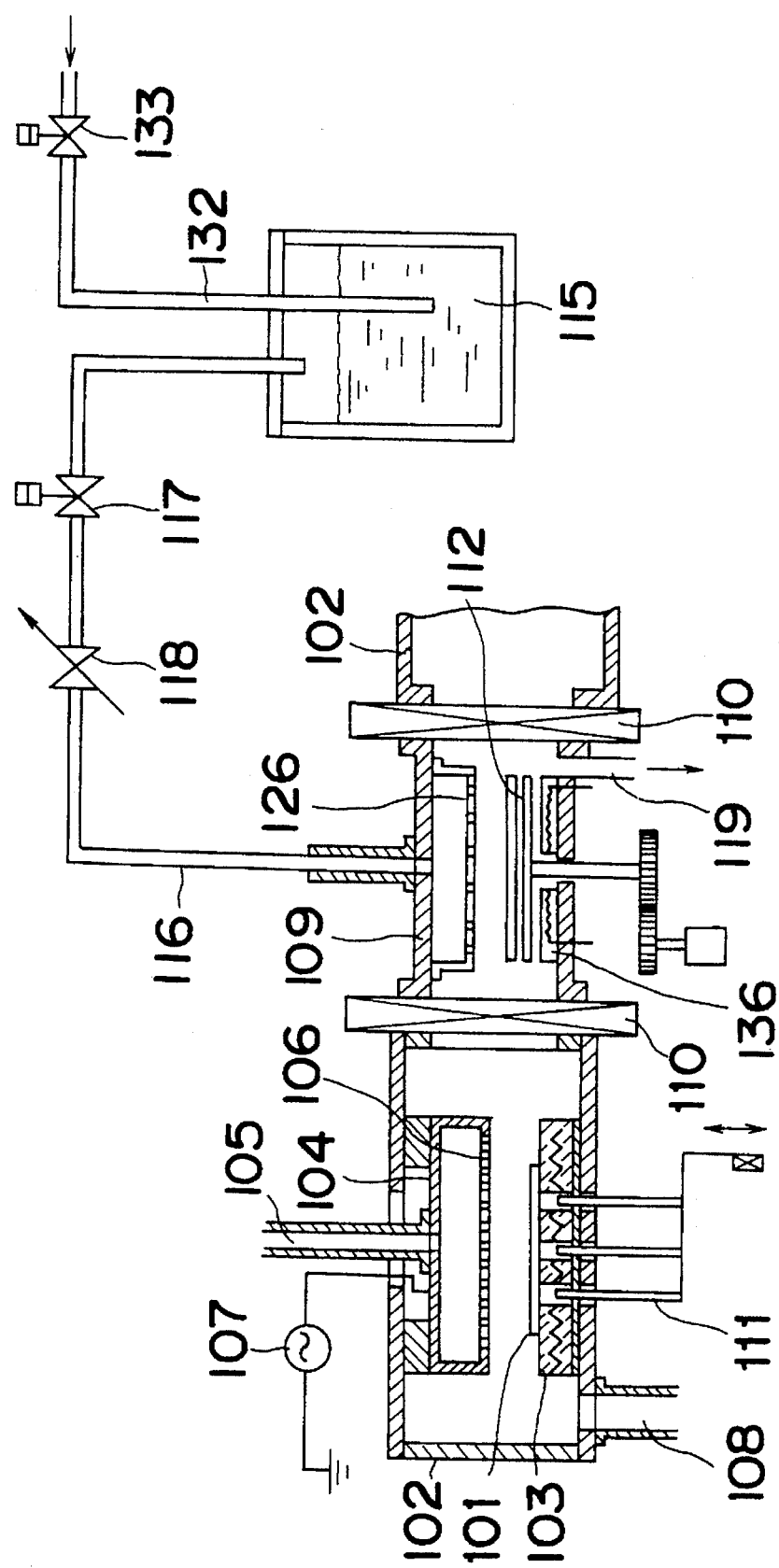
FIG. 9 is a cross sectional view of a thin film forming apparatus in a fifth embodiment of the present invention.
Figure 10:
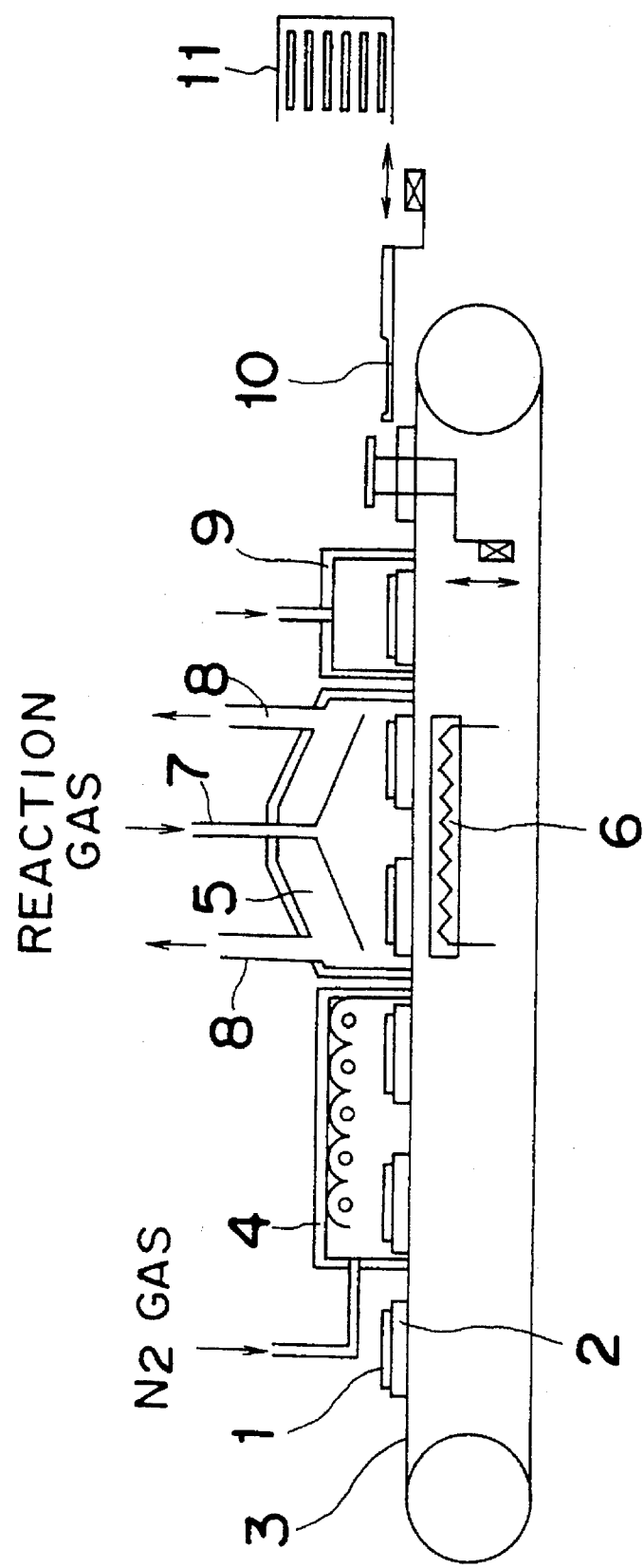
FIG. 10 is a cross sectional view of a conventional atmospheric pressure CVD apparatus.

FIG. 9 is a cross sectional structural diagram of a CVD apparatus or a plasma dry etching apparatus. The components designated by 101, 102, 109, 110, 112, 116, 119, and 126 are the same as those of FIG. 7. More specifically, 101 is a substrate, 102 a vacuum chamber for a CVD process or a dry etching process, 109 an arm accommodating chamber, 110 a gate valve, 112 a transferring/holding arm, 116 an organic material gas feed pipe, 119 a second discharge port connected to the arm accommodating chamber 109, and 126 an organic material gas blow-out plate.

What is different from the fourth embodiment is that a plate 136 incorporating a heater is arranged at one side, and the organic material gas feed pipe 116 and the organic material gas blow-out plate 126 are set at the other side of the arm accommodating chamber 109 via the transferring/holding arm 112, so that an organic molecular layer is formed on the surface of the substrate 101 in the arm accommodating chamber 109.

Since the organic molecular layer forming chamber functions also as the arm accommodating chamber 109, the continuous processing apparatus as in FIG. 8 can be simplified in structure.

In each of the foregoing embodiments, HMDS is used as an organic liquid material to form the organic molecular layer. However, the compound including silane, siloxane disilazane, trisilazane, siloxysilane, and piperazine, or the compound including germanium halide and aminogermanium can be as effective as HMDS.

As is fully described hereinabove, the organic molecular layer forming chamber with means for feeding the material to form an organic molecular layer including silicon or germanium on the surface of the substrate is coupled to or provided adjacent to the film forming chamber, or the material feeding means is arranged in the film forming chamber. Therefore, the organic molecular layer is formed on the thin film of the substrate, thus preventing the thin film from absorbing moisture. It becomes possible to prevent the generation of dust and the deterioration of the film properties. When the molecular organic film is formed before the formation of the thin film, even if different kinds of material are intermingled on the surface of the substrate, the thin film can be formed uniformly without dependence on the undercoat. Moreover, since the film forming chamber, the etching processing chamber, and the organic molecular layer forming chamber are defined in one apparatus and the substrate is transferred therebetween by the transferring means, it becomes possible to prevent the irregularity of the thin film resulting from the dependency on the undercoat, and the generation of dust and the deterioration of the film properties. The thin film can be continuously formed or etched with good yield. The substrate transferring means arranged in the organic molecular layer forming chamber simplifies the structure of the apparatus.

That is, after the thin film is formed on the substrate in the processing chamber, the organic molecular layer including silicon or germanium is formed on the surface of the thin film in the processing chamber or in the organic molecular layer forming chamber where the substrate is passed in a short time. Therefore, moisture is prevented from being mixed into the thin film after the film is formed. In other words, since the surface of the thin film has an OH group unless it is treated, the OH group would be readily coupled with the moisture to thereby generate dusts or deteriorate the properties of the film. According to the present invention, however, the organic material including silicon or germanium is supplied to the surface of the film, and substituted with H in the OH group as indicated in FIG. 2, coupled with Si or Ge. Accordingly, a hydrophobic organic molecular layer is formed to thereby prevent the generation of dust on the surface of the substrate and deterioration of the film properties.

Moreover, since the organic molecular layer including silicon or germanium is formed on the whole surface of the substrate in the organic molecular layer forming chamber or in the thin film forming chamber before the formation of the thin film, it is possible to form the thin film uniformly with no dependence on the undercoat even when a pattern of various kinds of materials is on the surface of the substrate. The organic molecular layer is evaporated and scattered easily in a next process, thus not having an adverse influences to the substrate.

Although the present invention has been fully described in connection with the preferred embodiments thereof and with reference to the accompanying drawings, it is to be noted that various changes and modifications will be apparent to those skilled in the art. Such changes and modifications are to be understood as included within the scope of the present invention as defined by the appended claims unless they depart therefrom.

What is claimed is:

1. An apparatus comprising:

a vacuum chamber for forming a thin film on a substrate, said vacuum chamber having a gas blow-out plate therein for blowing gas into said vacuum chamber;

an organic molecular layer forming chamber located adjacent to said vacuum chamber for forming an organic layer on the substrate, said forming chamber comprising a substrate carrying device therein, said substrate carrying device comprising a transfer arm movable between one position in said vacuum chamber and another position in said forming chamber for transferring the substrate between said vacuum chamber and said forming chamber, and an organic material gas blow-out plate; and a feeding device connected with said organic material gas blow-out plate for feeding material to said forming chamber for forming an organic molecular layer that includes one of silicon and germanium on the surface of the substrate;

wherein said gas blow-out plate of said vacuum chamber has a plurality of blow-holes therein for blowing gas located opposite to said transfer arm when said transfer arm is in said one position in said vacuum chamber and said organic material gas blow-out plate has a plurality of blow-holes therein for blowing gas located opposite to said transfer arm when said transfer arm in said another position in said forming chamber.

2. The apparatus of claim 1, wherein said vacuum chamber and said forming chamber are connected to each other through a gate valve through which said transfer arm of said substrate carrying device can move.

3. The apparatus of claim 1, wherein said feeding device comprises a vaporizer for heating and vaporizing an organic liquid material that includes one of silicon and germanium.

4. The apparatus of claim 3, wherein said vaporizer is connected to a container having said organic liquid material therein, said organic liquid material being selected from the group consisting of a compound comprising silane, silozane, disilazine, trisilazane, siloxysilane, and piperazine, and a compound comprising germanium halogen and aminogermanium.

5. The apparatus of claim 1, wherein said vacuum chamber further comprises a discharge port and a gas introduction port connected with said gas blow-out plate.

6. The apparatus of claim 1, wherein said vacuum chamber further comprises a high frequency power source connected with an impressing electrode, said impressing electrode being connected with said gas blow-out plate thereof.

7. The apparatus of claim 1, wherein said vacuum chamber further comprises a susceptor for supporting the substrate thereon and a push-up pin movable up through said susceptor.

8. The apparatus of claim 1, wherein said forming chamber further comprises a heater plate, said heater plate and said organic material gas blow-out plate having said transfer arm therebetween in said another position thereof.

9. The apparatus of claim 1, wherein a plurality of said vacuum chamber are connected to said forming chamber by respective gate valves, said transfer arm being movable through said respective gate valves into the respective vacuum chambers.

* * * * *